(12) United States Patent
Lin

(10) Patent No.: US 6,207,328 B1
(45) Date of Patent: Mar. 27, 2001

(54) METHOD OF FORMING A PHASE SHIFT MASK

(75) Inventor: Benjamin Szu-Min Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/378,704

(22) Filed: Aug. 23, 1999

(51) Int. Cl.[7] ............................................. G03F 9/00
(52) U.S. Cl. ................................................... 430/5
(58) Field of Search ................... 430/5, 322, 323, 430/313, 311

(56) References Cited

U.S. PATENT DOCUMENTS 5,637,425 * 6/1997 Lee et al. ................................. 430/5

* cited by examiner

Primary Examiner—S. Rosasco
(74) Attorney, Agent, or Firm—Winston Hsu

(57) ABSTRACT

The present invention relates to a method of forming a phase shift mask on a mask substrate. This method comprises sequentially forming a phase shifter layer and a shield layer on the mask substrate, forming a photo-resist layer on a predetermined region of the shield layer, wherein the periphery of the photo-resist layer comprises at least one vertical side-wall, and forming a deposition layer uniformly on the photo-resist layer and the shield layer surrounding the photo-resist layer. Next, silylanizing the deposition layer. Next, performing an anisotropic etching process to remove the deposition layer on top of the photo-resist layer and the shield layer surrounding the photo-resist layer, and to partially remove the deposition layer covered on the vertical side-wall of the photo-resist layer so as to form a spacer on the vertical side-wall of the photo-resist layer. Then, vertically removing the shield layer and the phase shifter layer not covered by the photo-resist layer and the spacer, and vertically removing the spacer and the shield layer under the spacer. Lastly, removing the photo-resist layer completely to complete the phase shift mask.

7 Claims, 5 Drawing Sheets

METHOD OF FORMING A PHASE SHIFT MASK

BACKGROUND OF THE INVENTION

1. Field of the Invention

The present invention relates to a semiconductor process, and more particularly, to a method of forming a phase shift mask for the semiconductor wafer.

2. Description of the Prior Art

In order to define the circuit of the integrated circuits in a semiconductor process, the designed pattern is initially formed on the mask and then transferred onto the semiconductor wafer by lithography process. A prior art phase shift mask comprises a flat glass substrate, a phase shifter layer, and a chromium (Cr) layer with the pattern on it. The pattern on the Cr layer is formed by the exposure and the development processes. When transferring the pattern of the phase shift mask onto the semiconductor wafer, the phase shifter layer can generate 180° phase shift angle for the light penetrating through, which can reduce the pattern boundary vibration so as to accurately transfer the pattern onto the semiconductor wafer.

Please refer to FIG. 1 to FIG. 4. FIG. 1 to FIG. 4 are schematic diagrams of a prior art method of forming a phase shift mask 20. A prior art method of forming a phase shift mask 20 is performed on a mask substrate 10 made of quartz. According to the designed pattern, the mask substrate 10 comprises a predetermined region A and a predetermined region B. When forming the phase shift mask 20, a phase shifter layer 12 and a shield layer 14 are subsequently formed on the mask substrate 10. Next, a first lithography process is performed to form a first photo-resist layer 16 on the surface of the predetermined region A of the mask substrate 10, as shown in FIG. 1. Then, a first etching process is performed to vertically remove the shield layer 14 not covered by the first photo-resist layer 16, and then remove the first photo-resist layer 16 completely, as shown in FIG. 2. And next, a second lithography process is performed to form a second photo-resist layer 18 on the surface of the predetermined region B of the mask substrate 10, as shown in FIG. 3. Then, a second etching process is performed to vertically remove the phase shifter layer 12 not covered by the second photo-resist layer 18, and then the second photo-resist layer is completely removed, as shown in FIG. 4, so as to complete the phase shift mask 20.

The prior art method of forming the phase shift mask 20 has to perform the first lithography process to form the first photo-resist layer 16 and remove the shield layer 14 surrounding the predetermined region A, and then perform the second lithography process to form the second photo-resist layer 18 and remove the phase shifter layer 12 surrounding the predetermined region B. Since the prior art method has to repeat the lithography process, the alignment accuracy of the pattern finally formed on the phase mask 20 may be reduced which may affect the quality of the subsequent semiconductor process. Besides, repeating the lithography process may raise the processing cost, and reduce the profit of the semiconductor product.

SUMMARY OF THE INVENTION

It is therefore a primary objective of the present invention to provide a method of forming a phase shift mask to solve the above mentioned problem.

In a preferred embodiment, the present invention relates to a method of forming a phase shift mask on a mask substrate comprising:

sequentially forming a phase shifter layer and a shield layer on the mask substrate;

forming a photo-resist layer on a predetermined region of the shield layer, the periphery of the photo-resist layer comprising at least one vertical side-wall;

forming a deposition layer uniformly on the photo-resist layer and the shield layer surrounding the photo-resist layer;

silylanizing the deposition layer;

performing an anisotropic etching process to remove the deposition layer on top of the photo-resist layer and the shield layer surrounding the photo-resist layer, and to partially remove the deposition layer covered on the vertical side-wall of the photo-resist layer so as to form a spacer on the vertical side wall of the photo-resist layer;

vertically removing the shield layer and the phase shifter layer not covered by the photo-resist layer and the spacer, and vertically removing the spacer and the shield layer under the spacer; and removing the photo-resist layer completely to complete the phase shift mask.

It is an advantage of the present invention that it can increase the alignment accuracy of the pattern formed on the phase shift mask and reduce the processing cost.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
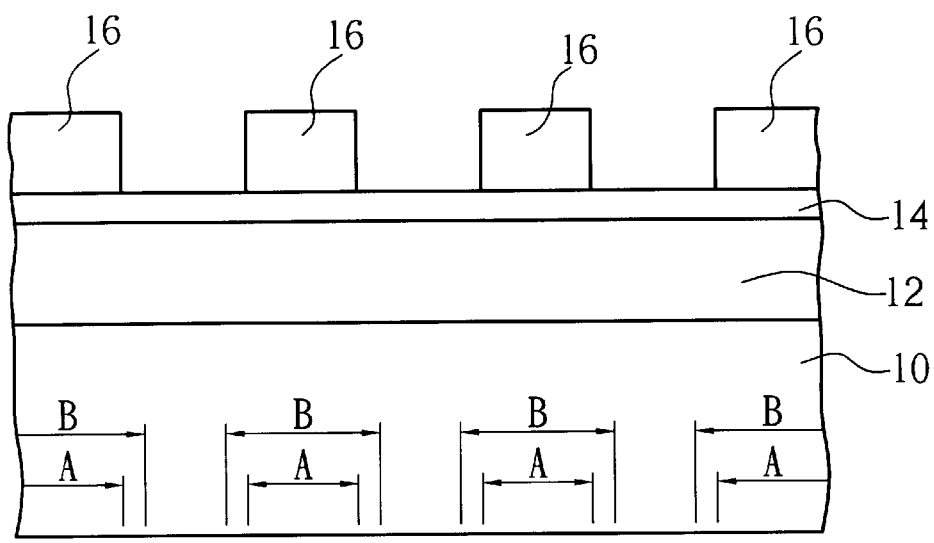
FIG. 1 to FIG. 4 are schematic diagrams of a prior art method of forming a phase shift mask.
Figure 2:
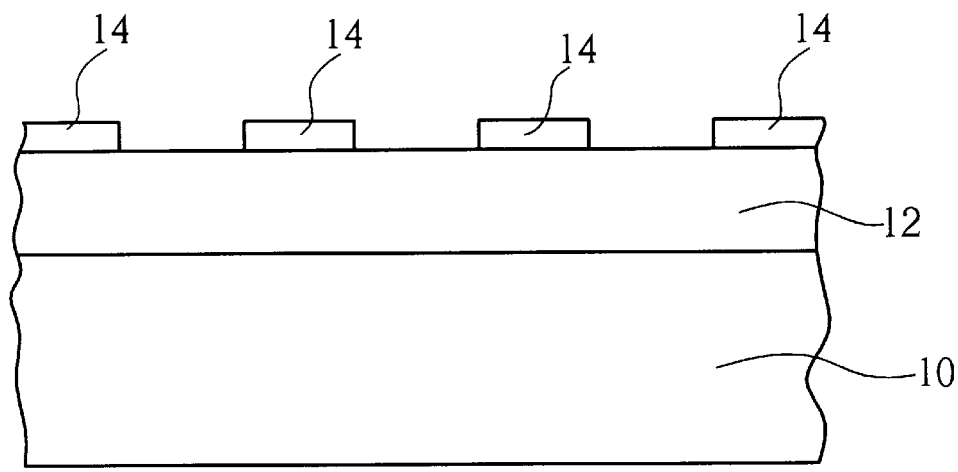
Figure 3:
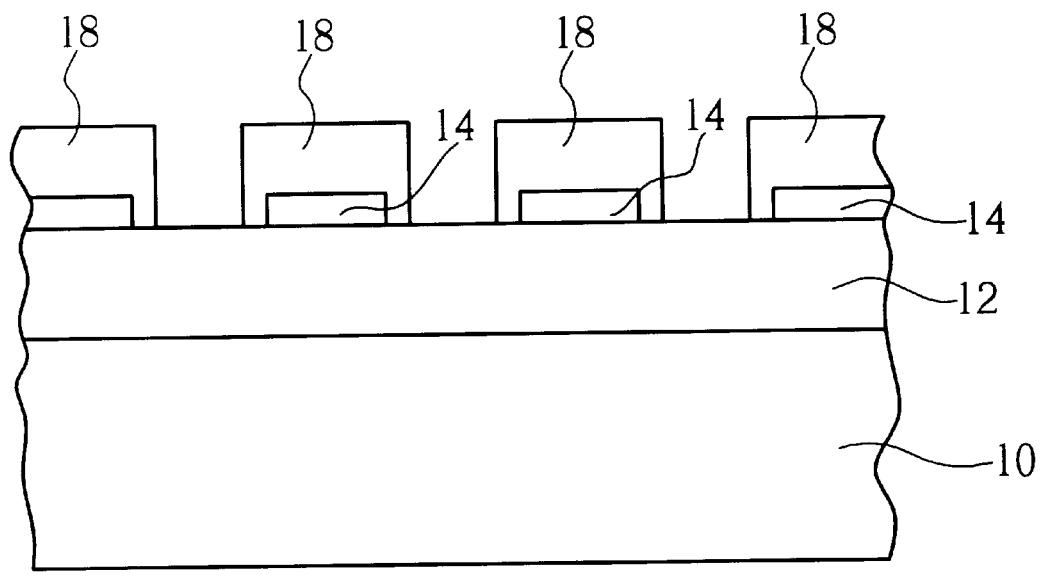
Figure 4:
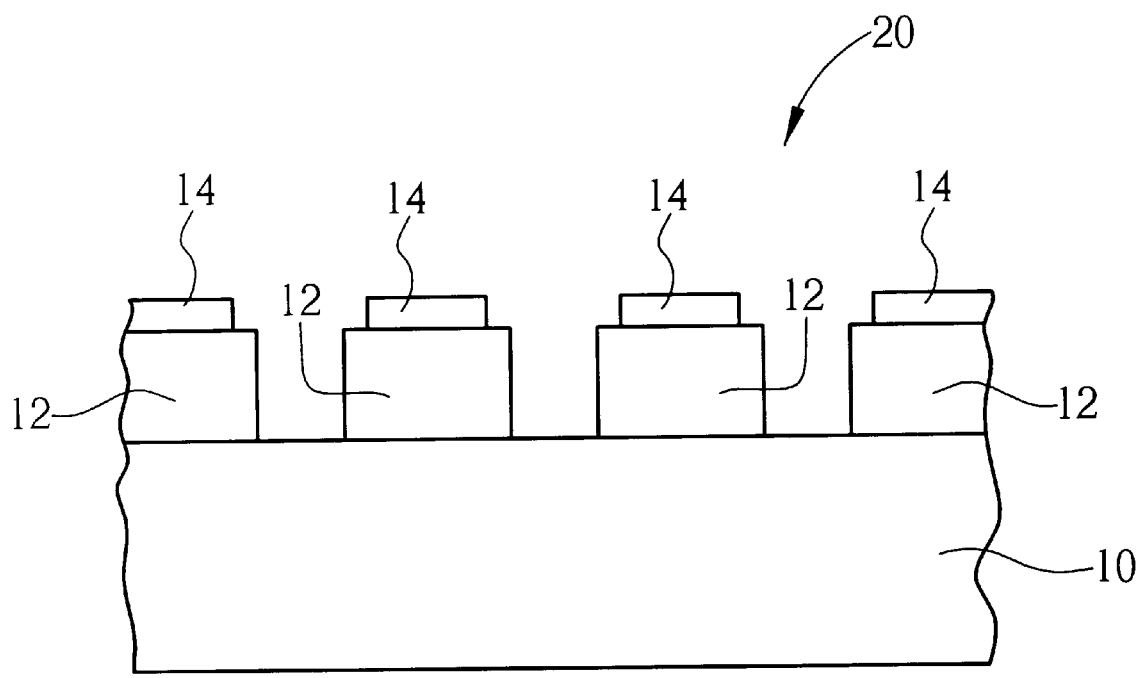
Figure 5:
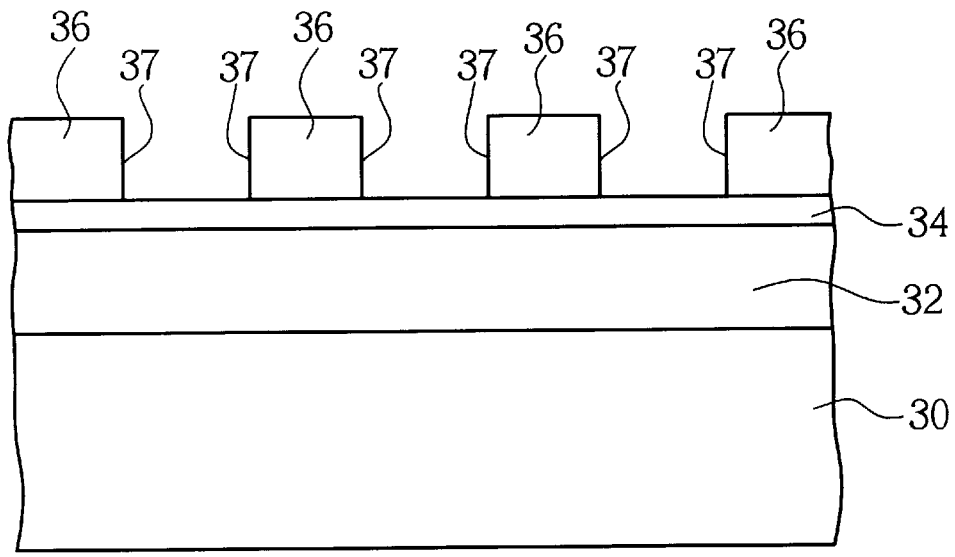
FIG. 5 to FIG. 10 are schematic diagrams of the method of forming a phase shift mask according to the present invention.

Please refer to FIG. 5 to FIG. 10. FIG. 5 to FIG. 10 are schematic diagrams of the method of forming a phase shift mask 20 according to the present invention. The method of the present invention is performed on a mask substrate 30 made of quartz. In the formation of the phase shifter mask 42, a phase shifter layer 32 and a shield layer 34 are subsequently formed on the mask substrate 30. The luminousness of the phase shifter layer is about 3~10%. The phase shifter layer can generate 180° phase shift angle for the light penetrating through. The phase shifter layer is made of MoSiON, $SiN_x$, irregular carbon or CrF. The shield layer is made of Cr, Al or MoSi. Then, a lithography process is performed to form a photo-resist layer 36 on the predetermined region of the shield layer 34, and the periphery of the photo-resist layer 36 comprises at least one vertical side-wall, as shown in FIG. 5.

Figure 6:
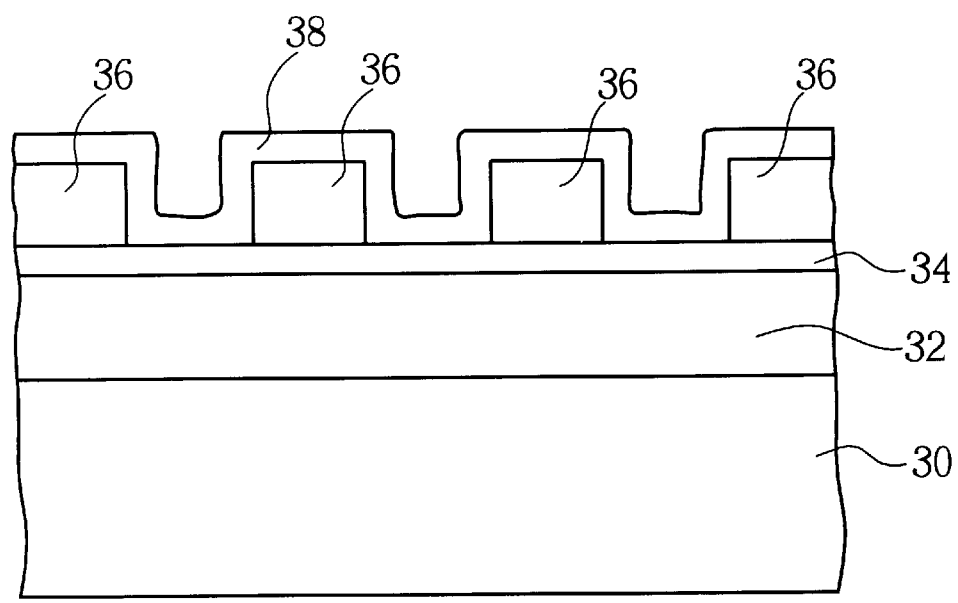
Figure 7:
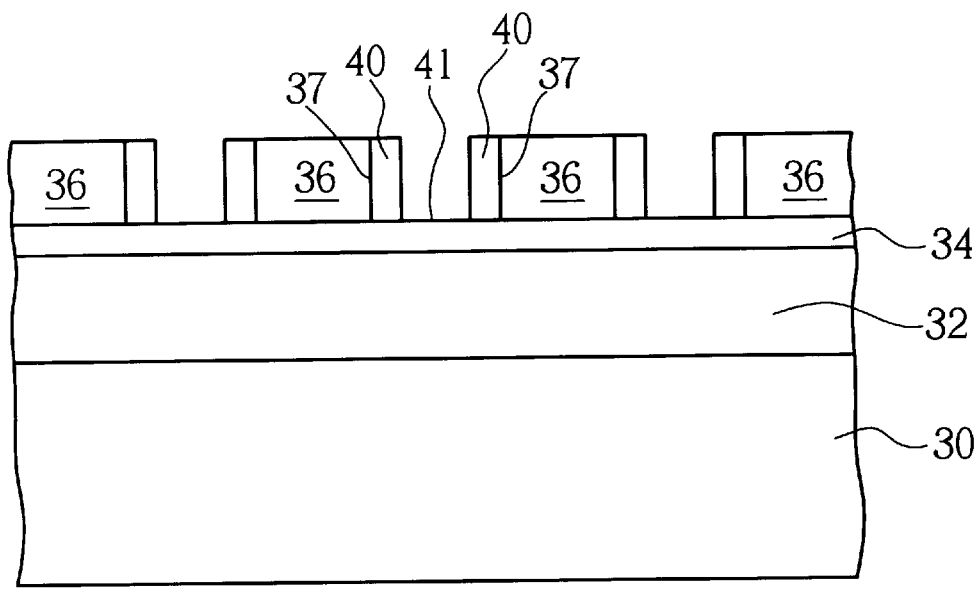
Figure 8:
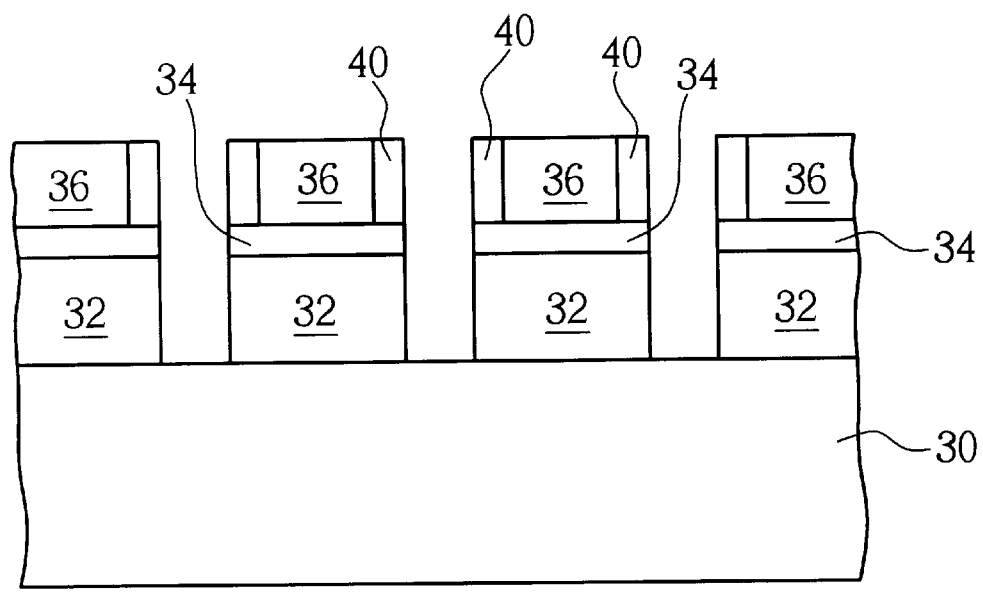
Figure 9:
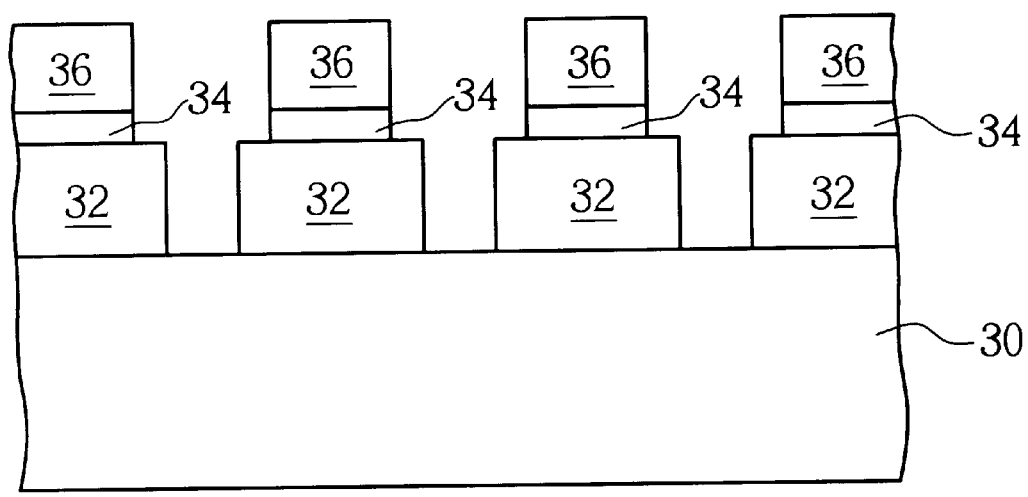
Figure 10:
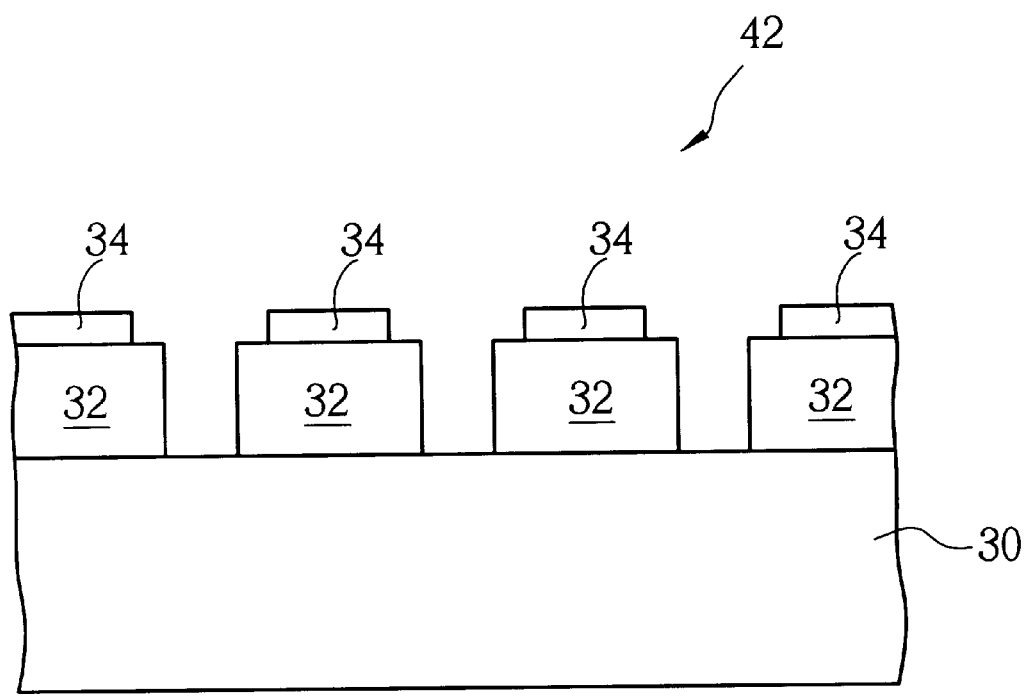

Next, a deposition layer made of hexamethyldisilazane (HMDS) is formed uniformly on the photo-resist layer 36 and the shield layer 34 surrounding the photo-resist layer 36, as shown in FIG. 6. Next, silylanizing the deposition layer 38. Then, an anisotropic etching process is performed to remove the deposition layer 38 on the top of the photo-resist layer 36 and the shield layer surrounding the photo-resist layer 36, and to partially remove the deposition layer 38 covered on the vertical side-wall 37 of the photo-resist layer 36 so as to form a spacer 40 on the vertical side-wall of the photo-resist layer 36. So the place not covered by the photo-resist layer 36 and the spacer 40 forms a groove 41, as shown in FIG. 7. Then, the shield layer 34 and the phase shifter layer 32 not covered by the photo-resist layer 36 and the spacer 40 is removed vertically, as shown in FIG. 8. And the spacer and the shield layer under the spacer are removed vertically, as shown in FIG. 9. Lastly, the photo-resist layer 36 is completely removed to complete the phase shift mask 42, as shown in FIG. 10.

The method according to the present invention only uses the photo-resist layer 36 and the spacer 40 on the vertical side-wall 37 of the photo-resist layer 36 to define the profile of the pattern on the mask substrate 30. In the formation of the phase shift mask 42, the lithography process is performed only once to form the photo-resist layer 36, so the alignment accuracy of the pattern will be increased and the processing cost will be reduced.

In contrast to the prior art method, the method of forming the phase shift mask 42 according to the present invention utilizes the photo-resist layer 36 on the predetermined region of the shield layer 34 and the spacer 40 on the vertical side-wall 37 of the photo-resist layer 36 to define the profile of the pattern. Therefore, the method of the present invention performs the lithography process only once, which can improve the alignment accuracy of the pattern and also reduce the processing cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a phase shift mask on a mask substrate comprising:

sequentially forming a phase shifter layer and a shield layer on the mask substrate;

forming a photo-resist layer on a predetermined region of the shield layer, the periphery of the photo-resist layer comprising at least one vertical side-wall;

forming a deposition layer uniformly on the photo-resist layer and the shield layer surrounding the photo-resist layer;

silylanizing the deposition layer;

performing an anisotropic etching process to remove the deposition layer on top of the photo-resist layer and the shield layer surrounding the photo-resist layer, and to partially remove the deposition layer covered on the vertical side-wall of the photo-resist layer so as to form a spacer on the vertical side wall of the photo-resist layer;

vertically removing the shield layer and the phase shifter layer not covered by the photo-resist layer and the spacer, and vertically removing the spacer and the shield layer under the spacer; and removing the photo-resist layer completely to complete the phase shift mask.

2. The method of claim 1 wherein the deposition layer is made of hexamethyldisilazane (HMDS).

3. The method of claim 1 wherein the mask substrate is made of quartz.

4. The method of claim 1 wherein the shield layer is made of Cr, Al or MoSi.

5. The method of claim 1 wherein the phase shifter layer can generate 180° phase shift angle for the light penetrating through.

6. The method of claim 1 wherein the luminousness of the phase shifter layer is about 3~10%.

7. The method of claim 1 wherein the phase shifter layer is made of MoSiON, $SiN_x$, irregular carbon or CrF.

* * * * *